United States Patent
Shih et al.

(10) Patent No.: US 7,052,553 B1
(45) Date of Patent: May 30, 2006

(54) WET CLEANING OF ELECTROSTATIC CHUCKS

(75) Inventors: Hong Shih, Walnut, CA (US); Tuochuan Huang, Saratoga, CA (US); Catherine Zhou, Fremont, CA (US); Bruno Morel, Santa Clara, CA (US); Brian McMillin, Fremont, CA (US); Paul Mulgrew, Mountain View, CA (US); Armen Avoyan, Glendale, CA (US)

(73) Assignee: Lam Research Corporation, Fremont, CA (US)

( * ) Notice: Subject to any disclaimer, the term of this patent is extended or adjusted under 35 U.S.C. 154(b) by 6 days.

(21) Appl. No.: 11/000,388

(22) Filed: Dec. 1, 2004

(51) Int. Cl.
*B08B 6/00* (2006.01)

(52) U.S. Cl. .............. 134/1; 134/26; 134/27; 134/28; 134/29; 134/30; 134/31; 134/34; 134/35; 134/36; 134/41; 134/42

(58) Field of Classification Search ........ 134/1, 134/26, 27–29, 30–31, 34–36, 41–42
See application file for complete search history.

(56) References Cited

U.S. PATENT DOCUMENTS

| | | | | |
|---|---|---|---|---|
| 5,211,807 A | * | 5/1993 | Yee | 216/100 |
| 5,507,874 A | * | 4/1996 | Su et al. | 134/1 |
| 5,516,730 A | * | 5/1996 | Pirooz et al. | 438/473 |
| 5,653,045 A | * | 8/1997 | Ferrell | 34/341 |
| 6,026,830 A | * | 2/2000 | Huang | 134/66 |
| 6,607,605 B1 | | 8/2003 | Tan | |
| 6,810,887 B1 | | 11/2004 | Tan | |
| 2002/0153024 A1 | * | 10/2002 | Akiba | 134/1.1 |
| 2002/0189640 A1 | * | 12/2002 | Linn et al. | 134/3 |
| 2003/0080333 A1 | | 5/2003 | Yamaguchi et al. | |
| 2003/0129772 A1 | | 7/2003 | Choi | |
| 2003/0136428 A1 | * | 7/2003 | Krogh | 134/28 |
| 2003/0200996 A1 | * | 10/2003 | Hiatt et al. | 134/21 |
| 2003/0221702 A1 | | 12/2003 | Peebles | |
| 2004/0069320 A1 | * | 4/2004 | Bergman | 134/2 |
| 2004/0079385 A1 | | 4/2004 | Frisa et al. | |
| 2004/0099285 A1 | | 5/2004 | Wang et al. | |
| 2004/0159333 A1 | * | 8/2004 | Shirley et al. | 134/6 |
| 2004/0231706 A1 | * | 11/2004 | Bhatnagar et al. | 134/28 |

OTHER PUBLICATIONS

Marcel Pourbaix, "Atlas of Electrochemical Equilibria in Aqueous Solutions", National Association of Corrosion Engineers, Houston, Texas, 1974, Table of Contents.
David R. Lide, "CRC Handbook of Chemistry and Physics," 71st Ed., 1990-91, CRC Press, Boca Raton, Table of Contents and 8-16 to 8-21.

* cited by examiner

*Primary Examiner*—Sharidan Carrillo
(74) *Attorney, Agent, or Firm*—Buchanan Ingersoll PC

(57) ABSTRACT

A non-destructive and simple method for cleaning a new or used electrostatic chuck comprises a wet cleaning process, which removes contaminants deposited on a surface of the electrostatic chuck.

21 Claims, No Drawings

WET CLEANING OF ELECTROSTATIC CHUCKS

BACKGROUND

An electrostatic chuck (ESC), a component of semiconductor processing equipment such as plasma etch chambers, can be used for transporting, holding and/or temperature control of a semiconductor wafer or glass substrate (i.e., flat panel display) during processing, for example, in a chemical vapor deposition (CVD), physical vapor deposition (PVD), or etch reactor. ESCs often exhibit short lifetimes resulting in failures including, for example, dynamic alignment failure, high leakage of helium cooling gas between the ESC and the underside of a supported substrate, increased dechucking time, and sticking of the substrate to the ESC or dechucking failure. The early failure of ESCs can cause substrate breakage, impact throughput, lead to particle and defect issues, and increase ownership costs of plasma processing equipment incorporating such ESCs.

SUMMARY

Provided is a method of cleaning a new or used electrostatic chuck useful for plasma etching of a dielectric layer on a semiconductor substrate. The chuck includes a ceramic surface on which the semiconductor substrate is supported during the etching. The method comprises contacting at least the ceramic surface of the chuck with (a) isopropyl alcohol; (b) a basic solution that comprises hydrogen peroxide and ammonium hydroxide; (c) a dilute acidic solution that comprises a hydrofluoric acid and nitric acid mixture and/or a dilute acidic solution that comprises a hydrochloric acid and hydrogen peroxide mixture; and/or (d) ultrasonic cleaning, whereby contaminants are removed from the ceramic surface of the chuck. When cleaning a used chuck previously used for supporting a semiconductor substrate during plasma etching of a dielectric layer on the semiconductor substrate, the method preferably further comprises contacting at least the ceramic surface of the chuck with tetramethyl ammonium hydroxide.

DETAILED DESCRIPTION

A non-destructive and simple method for cleaning ESCs comprises a wet cleaning process, which does not require stripping or at least partial removal and redepositing a ceramic layer on the ESC. The wet cleaning process comprises cleaning the ESC with organic solvent, basic solution, optionally tetramethyl ammonium hydroxide (TMAH), and dilute acidic solution, as well as ultrasonic cleaning.

Scanning Electron Microscopy (SEM) and Energy Dispersive Spectroscopy (EDS) analysis of used ESCs reveals deposition of contaminants on ceramic ESC surfaces following etching. The contaminants change the surface characteristics of the ESCs and cause early failure, as ESC performance greatly depends on the cleanliness of ESC surfaces. Among the contaminants deposited on ESC surfaces during manufacturing of new chucks or when used for dielectric plasma etching are organic impurities, metallic impurities, fluoride impurities, electrode impurities, silicon particles, surface particles, and combinations thereof. More specifically, examples of fluoride impurities include, for example, aluminum fluoride, titanium fluoride, and combinations thereof; examples of metallic impurities include iron, chromium, nickel, molybdenum, vanadium, and combinations thereof; examples of electrode impurities include, tungsten, phosphorus, and combinations thereof; examples of silicon particles include, for example, Si, $SiO_2$, and combinations thereof. It has been surprisingly discovered that new ESCs can be preconditioned and used ESCs can be recovered by cleaning the contaminants resulting from manufacturing or deposited on the ESCs during etching to refresh the ceramic surface by means of a wet cleaning process.

As used herein, dielectric ESCs refer to ESCs used in dielectric etch processes such as plasma etching silicon oxide and low-k materials. An exemplary dielectric ESC can comprise a metal base (e.g., anodized or non-anodized aluminum alloy) with a ceramic surface on which a semiconductor or substrate such as a wafer is supported. As an example, the ceramic surface may comprise a sintered laminate comprising a patterned refractory (e.g., tungsten or molybdenum) electrode between two ceramic layers (e.g., thin ceramic layers approximately 20 mils thick). The laminate may be bonded to the metal base with a bonding material such as a silicone based material containing conductive powders (e.g., aluminum, silicon, or the like). The metal base, approximately 1.5 inches thick, typically includes RF and DC power feeds, through holes for lift pins, helium gas passages, channels for temperature controlled fluid circulation, temperature sensing arrangements, and the like.

ESCs are typically either Coulombic or Johnsen-Rahbek type. Coulombic type ESCs use a dielectric surface layer having a higher electrical resistance to generate coulombic electrostatic forces. Johnsen-Rahbek type ESCs, which often provide higher electrostatic clamping forces for a lower applied voltage, utilize lower resistance dielectric surface layers such as $Al_2O_3$ doped with, for example, $TiO_2$.

According to an embodiment, the ceramic dielectric layer of a Johnsen-Rahbek type ESC may comprise 94% $Al_2O_3$, 4% $SiO_2$, 1% $TiO_2$, and 1% CaO, as well as trace amounts of MgO, Si, Ti, Ca, and Mg. According to another embodiment, for a Coulombic type ESC, the ceramic dielectric layer may comprise greater than or equal to 99% $Al_2O_3$. Thus, depending on the composition of the ceramic layer, elements such as Ti, Si, Mg, and Ca may not be considered contaminants to be removed by the wet cleaning process. In contrast, contaminants such as metal particles and electrode particles (e.g., tungsten or molybdenum) are preferably removed from the surface of the ESC by the wet cleaning process.

Contaminants such as, for example, organic impurities, metallic impurities, and electrode impurities may be found on new ESCs while contaminants such as, for example, organic impurities, fluoride impurities, and silicon particles, may be deposited on the ceramic surface of used ESCs during dielectric etching. The components of the wet cleaning process, i.e., organic solvent, basic solution, optional TMAH, dilute acidic solutions, and ultrasonic cleaning, serve to remove specific contaminants that may be found on ceramic ESC surfaces.

For example, the isopropyl alcohol (IPA, 100%, conforming to SEMI Specification C41-1101A, Grade 1 or better) serves to remove organic impurities. While it is contemplated that other organic solvents may be used, acetone is preferably avoided, as acetone may attack the ESC bonding material.

The basic solution serves to remove organic impurities, metallic impurities, and titanium fluoride. An exemplary basic solution for use in the wet cleaning process may comprise hydrogen peroxide ($H_2O_2$) (30%, semiconductor grade, conforming to SEMI Specification C30-1101, Grade 1 or better) and ammonium hydroxide ($NH_4OH$) (29%, semiconductor grade, conforming to SEMI Specification C21-0301, Grade 1 or better). Hydrogen peroxide is a strong oxidizer with a high standard reduction potential. The hydrogen peroxide can react with metal to form metal ions in the weak basic solution of ammonium hydroxide and hydrogen peroxide, which is stable at least up to 70° C. The standard reduction potential of hydrogen peroxide is:

$$H_2O_2 + 2H^+ + 2e^- = 2H_2O$$

$E° = 1.776V$ (versus standard hydrogen electrode (SHE))

and the standard reduction potential of hydrogen peroxide in weak basic solution is:

$$HO_2^- + H_2O + 2e^- = 3OH^-$$

$E° = 0.878V$ (versus SHE).

The ammonium hydroxide can form complex ions, such as $Cu(NH_3)_4^{2+}$ and $Ni(NH_3)_4^{2+}$, with metallic impurities. Since the use of hydrogen peroxide increases the surface potential of ESC ceramic surfaces, it can reduce the redeposition or surface absorption of metals after previous chemical cleaning of ESC ceramic surfaces. For example, the standard reduction potential of copper is:

$$Cu^{2+} + 2e^- = Cu$$

$E° = 0.337V$ (versus SHE)

and the reduction potential of silicon is:

$$Si + 2H_2O + 2H^+ + 2e^- = 2H_2O$$

$E° = -0.857V$ (versus SHE).

Thus, silicon can provide electrons to $Cu^{2+}$ to form copper metal, which can be absorbed on the ESC ceramic surface. Hydrogen peroxide can remove electrons from silicon, allowing copper to form $Cu(NH_3)_4^{2+}$, which can be removed.

The optional TMAH (e.g., 2.38 weight %, CC-238S non-ionic developer from Cyantek, Corp., Fremont, Calif.) serves to remove aluminum fluoride, a contaminant that may be found on used ESCs. Thus, used ESCs are preferably cleaned with TMAH.

An exemplary acidic solution for use in the wet cleaning process may comprise hydrofluoric acid (HF) (49%, semiconductor grade, conforming to SEMI Specification C28-0301, Grade 1 or better) and nitric acid ($HNO_3$) (67%, semiconductor grade, conforming to SEMI Specification C35-0301, Grade 1 or better). The nitric acid serves to remove metal particles and electrode impurities and the hydrofluoric acid serves to remove silicon particles, such as $SiO_2$. The reaction of hydrofluoric acid with $SiO_2$ is as follows:

$$4HF + SiO_2 = SiF_4 + 2H_2O$$

$$6HF + SiO_2 = H_2SiF_6 + 2H_2O$$

There is a low concentration of $H^+$ and $F^-$ ions in a solution of hydrofluoric acid due to a low reaction constant of $k_1 1.3 \times 10^{-3}$ mol/liter. The presence of nitric acid, with common $H^+$ ions, should result in an even lower concentration of $F^-$ ions. As hydrofluoric acid may attack ceramic surfaces at their grain boundaries, special care is preferably taken in applying hydrofluoric acid to ceramic surfaces.

While not wishing to be bound by theory, it is believed that the addition of nitric acid is effective for metal and metal ion decontamination. As nitric acid is a strong oxidizer, it can react with active metals such as iron, nickel, aluminum, zinc, as well as inactive metals such as copper. The standard reduction potential of nitric acid is:

$$NO_3^- + 4H^+ + 3e^- = NO + 2H_2O$$

$E° = 0.957V$ (versus SHE)

Another exemplary acidic solution for use in the wet cleaning process may comprise hydrochloric acid (HCl) (conforming to SEMI Specification C28-0301, Grade 2 or better) and hydrogen peroxide. This acidic solution serves to remove metallic impurities and electrode impurities. Metal contaminants on ceramic surfaces may include, for example, copper, iron, nickel, titanium, aluminum, and other metal particles. According to Pourbaix Diagrams (E versus pH), in order to remove copper contaminants from ESC ceramic surfaces, the pH of the cleaning solution should be maintained at less than or equal to 6.0 for $Cu^{2+}$ or greater than or equal to 12.5 for $Cu(OH)_4^{2-}$ and the reaction potential on ESC ceramic surfaces should be controlled at 0.50 volts or higher versus SHE. Using nitric acid and hydrogen peroxide in an acidic solution will provide an appropriate ceramic surface potential to achieve an efficient removal of copper. While hydrofluoric acid alone would not be expected to remove copper contamination from an ESC ceramic surface, a solution of nitric acid with hydrofluoric acid and/or hydrogen peroxide with ammonium hydroxide should provide more effective copper decontamination of ESC ceramic surfaces. Metal particles such as iron, nickel, titanium, etc., can be effectively removed by a solution of hydrochloric acid and hydrogen peroxide, as iron and nickel can dissolve in hydrochloric acid and titanium can be oxidized by hydrogen peroxide and then dissolve in a solution of hydrochloric acid. The acidic solution comprising hydrochloric acid and hydrogen peroxide has demonstrated effective decontamination of metal and metal ions, such as aluminum, iron, nickel, and copper.

The acidic solution for use in the wet cleaning process may comprise a mixture of hydrofluoric acid and nitric acid and/or a mixture of hydrochloric acid and hydrogen peroxide. The acidic solution or solutions used may be based on the type of ESC and the conditions to which it is subjected during dielectric etching. For example, to prevent damage to the ceramic surface of a Johnsen-Rahbek type ESC operated at high power (e.g., 3000–6000 W), such an ESC preferably is not cleaned with hydrofluoric acid and nitric acid.

The ceramic surface of the ESC is preferably contacted with the acidic solution and TMAH by wiping while the ESC is on a fixture, with the ceramic surface facing downward. Use of the fixture allows cleaning with the acidic solution or TMAH without causing the cleaning solution to become trapped in passages of the ESC and damaging the bonding layer.

In addition to contacting the ceramic surface of the ESC with the above-described components of the wet cleaning process, cleaning of local stains may be assisted by careful use of a scouring pad, such as a 3M™ white Scotch Brite. The scouring helps to remove deposition and contamination (e.g., polymer buildup) on the ceramic surface of the ESC.

The ultrasonic cleaning serves to remove surface particles, as well as particles trapped inside passages in the ESC, for example, water channels, temperature sensor holes, lift pin holes, and through holes, such as helium supply holes and associated microchannels. A particle density on the ESC ceramic surface of less than 0.17 particles/cm² is desired following ultrasonic cleaning.

Chemical attack of the bonding area of an ESC during the wet cleaning process is undesirable. Thus, the corrosion resistance of a ESC bond was systematically studied by exposing the bond to different chemicals, with the results indicated in Table I.

TABLE I

| Chemical | Weight % | Temperature | | | |
|---|---|---|---|---|---|
| | | 25° C. | 40° C. | 66° C. | 90° C. |
| $H_2SO_4$ | <20 | ✓ | ✓ | ✓ | X |
| | 20–70 | ✓ | ✓ | X | |
| | 70–75 | ✓ | X | | |
| | >75 | X | | | |
| $HNO_3$ | <10 | * | X | | |
| | >10 | X | | | |
| HF | | ✓ | * | * | X |
| Acetic Acid | | ✓ | X | | |
| HCl | >20 | ✓ | ✓ | ✓ | * |
| | 20–37 | ✓ | ✓ | * | * |
| $NH_4OH$ | 0–10 | ✓ | ✓ | ✓ | ✓ |
| | 10–20 | ✓ | ✓ | ✓ | X |
| | 20–30 | ✓ | ✓ | X | X |
| $H_2O_2$ | <10 | * | * | X | |
| | 10–30 | * | X | | |
| $CO_2$ | | ✓ | ✓ | ✓ | * |
| IPA | | ✓ | ✓ | ✓ | |
| Acetone | | O | O | X | |

✓ Excellent corrosion resistance or very light corrosion
* Depends on the type of bond material used
O May be used, but with considerable corrosion or damage
X Severe corrosion or damage (cannot be used)

Coating the bonding area with MicroShield™ Masking Aid (Structure Probe, Inc., West Chester, Pa.), drying for 30 minutes, and covering with chemical resistant tape (e.g., Kapton™ tape or 3M™ Electroplating Tape #470, 484, or 854) was found to be an effective means of protecting the bonding area.

Similarly, contact with water, aqueous chemicals, or acetone, but not IPA, can adversely affect electrical contacts, including contacts with plastic insulators and silver coated contacts, on the backside of the ESC. Accordingly, electrical contacts and exposed bonding material on the ESC are preferably protected by covering with masking material and/or chemical resistant tape.

As noted above, ESC surfaces such as the wafer-contacting ceramic surface can be analyzed prior to subjecting the ESC to the wet cleaning process to determine whether contaminants are found on a surface of the ESC. Additionally, ESC surfaces can be analyzed after subjecting the ESC to the wet cleaning process to determine whether contaminants are found on a surface of the ESC. Further, plasma etch chamber performance of the ESC can be tested, prior to subjecting the ESC to the wet cleaning process, and preferably after subjecting the ESC to the wet cleaning process.

Plasma etching chamber performance tests include dechucking performance, such as, for example, time to dechuck for different wafer types, time to dechuck versus reverse polarity voltage (RPV), time to dechuck versus holding voltage, and time to reach helium threshold (helium rise time) versus holding voltage. Further chamber performance tests include, for example, wafer temperature measurements, dynamic alignment measurements, I-V curve measurements such as pole—pole versus current, and determining reverse polarity optimization.

Plasma etching chamber performance tests indicated that after wet cleaning a used ESC: (1) the ESC current during the I-V measurement was lower, (2) the optimum RPV shifts to a lower voltage, and (3) the helium rise time results improved. Thus, dechucking times would be lower after the clean, a wafer can be dechucked over an extended holding voltage range, and the window for optimal RPV is wider after the cleaning.

ESC measurements carried out prior to and/or after subjecting the ESC to the wet cleaning process include surface roughness (21 points), surface color uniformity, ceramic dielectric thickness, ceramic dielectric layer volume resistivity, electric resistivity, dielectric resistance and pole-to-baseplate resistance, surface pattern observation (White Light Interferometer (Zygo®, Middlefield, Conn.)), SEM and EDS analysis for surface morphology and composition analysis, and Inductively Coupled Plasma Mass Spectrometry (ICPMS) of the ESC ceramic surface.

EXAMPLES

The following wet cleaning processes, which can be used to clean new and used ESCs, are provided to be illustrative, but not limiting.

Example 1

Protect electrical contacts on the backside of a used dielectric ESC, including contacts with plastic insulators and silver coated contacts, with chemical resistant tape. Protect exposed bonding material at the edge of the ESC, immediately below the ceramic surface layer, by coating the bonding material with MicroShield™ Masking Aid, drying for 30 minutes, and covering with chemical resistant tape.

Rinse the ESC with ultrapure deionized water (UPW, resistivity ≧ 18 Mohm-cm at 25° C.) for 5 minutes, blow off excess water with filtered (0.05 to 0.1 µm) nitrogen, soak (immerse) the ESC in IPA for 20 minutes, and wipe the ESC with a lint-free cleanroom wipe.

Soak the ESC in 30% $H_2O_2$ solution for 20 minutes and wipe the ceramic surface with a lint-free cleanroom wipe. If necessary, remove local stains by carefully a 3M™ white Scotch Brite. Rinse the ESC with UPW for 5 minutes and blow off excess water with filtered nitrogen.

Wipe the ESC with IPA using a lint-free cleanroom wipe, rinse the ESC with UPW for 5 minutes, and blow off excess water with filtered nitrogen.

Place the ESC on a fixture, with the ceramic surface facing downward. Wipe the ceramic surface with a lint-free cleanroom wipe and a solution of $HF:HNO_3:H_2O$ (in a ratio of 1:5:50) for a maximum of 30 seconds. A 3M™ white Scotch Brite can be used with the solution. Rinse the ESC, including all of the helium holes and channels, with UPW for 10 minutes and blow off excess water with filtered nitrogen.

With the ESC facing downward on the fixture, wipe the ceramic surface with a lint-free cleanroom wipe and solution of $HCl:H_2O_2:H_2O$ (in a ratio of 1:2:10) for a maximum of 3 minutes. A 3M™ white Scotch Brite can be used with the solution. Rinse the ESC, including all of the helium holes and channels, with UPW for 10 minutes and blow off excess water with filtered nitrogen.

With the ESC facing downward on the fixture, wipe the ceramic surface with a lint-free cleanroom wipe and a solution of 2.38% TMAH for 5-10 minutes, depending on the degree of fluoride deposition, avoiding contact of the metal base with the solution. A 3M™ white Scotch Brite can be used with the solution. Rinse the ESC with UPW for 5 minutes and blow off excess water with filtered nitrogen.

Remove the ESC from the fixture and soak the ESC in a solution of $H_2O_2$:$NH_4OH$:$H_2O$ (in a ratio of 1:1:2) for 20 minutes, wipe the ESC with a lint-free cleanroom wipe or 3M™ white Scotch Brite, rinse the ESC with UPW for 5 minutes, and blow off excess water with filtered nitrogen.

Place the ESC facing downward on the fixture, with the ceramic surface facing downward. Wipe the ceramic surface with a lint-free cleanroom wipe and a solution of HCl:$H_2O_2$:$H_2O$ (in a ratio of 1:2:10) for a maximum of 30 seconds. A 3M™ white Scotch Brite can be used with the solution. Rinse the ESC, including all of the helium holes and channels, with UPW for 10 minutes and blow off excess water with filtered nitrogen.

Remove the MicroShield™ Masking Aid from the edge of the ESC using acetone and cotton swabs. Move the ESC to a Class 1000 Cleanroom and measure the roughness of the ceramic surface with a surface roughness tester, such as a Fowler Pocket Surf (Fred V. Fowler Co., Inc., Newton, Mass.). Mount (immerse) the ESC in an ultrasonic tank filled with UPW at room temperature and clean the ESC for 60 minutes. Orient the ESC in the ultrasonic tank with the ceramic surface facing downward, but supported above the bottom of the tank. The ceramic surface should not come into contact with the tank during the ultrasonic cleaning. Remove the chemical resistant tape from the backside of the ESC, wipe the ESC with IPA, and rinse helium holes and channels on the backside of the ESC with IPA. Blow dry the ESC, including the helium holes and channels, with nitrogen supplied through a hose or soft-tipped nozzle.

Move the ESC to a Class 100 Cleanroom and place it under a heating lamp or bake it in an oven at 120° C. for 90 minutes and allow the ESC to cool to 50–60° C. Measure surface particles on the ceramic surface, for example, with a QIII®+ Surface Particle Detector (Pentagon Technologies, Livermore, Calif.).

Example 2

The procedure of Example 2 is similar to the procedure of Example 1. However, cleaning times and cleaning components may vary, as indicated by Example 2. Protect electrical contacts on the backside of the ESC and wipe the ESC with IPA.

Soak the ESC in 30% $H_2O_2$ solution for 20 minutes and wipe the ceramic surface with a lint-free cleanroom wipe. If necessary, remove local stains by carefully using a 3M™ white Scotch Brite or a fine pad (sand paper) can be used. Rinse the ESC with UPW for 5 minutes and blow off excess water with filtered nitrogen.

Soak the ESC in IPA for 20 minutes, wipe the ESC using a lint-free cleanroom wipe, rinse the ESC with UPW for 5 minutes, and blow off excess water with filtered nitrogen.

Place the ESC on a fixture, with the ceramic surface facing downward. Wipe the ceramic surface with a lint-free cleanroom wipe and a solution of HF:$HNO_3$:$H_2O$ (in a ratio of 1:5:50) for a maximum of 30 seconds. A 3M™ white Scotch Brite or fine pad can be used with the solution. Rinse the ESC, including all of the lift pin holes and helium supply holes and channels, with UPW for 10 minutes and blow off excess water with filtered nitrogen.

With the ESC facing downward on the fixture, wipe the ceramic surface with a lint-free cleanroom wipe and a solution of 2.38% TMAH at room temperature for 5–10 minutes, depending on the degree of fluoride deposition on the ESC ceramic surface, avoiding contact of the metal base with the solution. Rinse the ESC with UPW for 5 minutes and blow off excess water with filtered nitrogen.

Remove the ESC from the fixture and soak the ESC in a solution of $NH_4OH$:$H_2O_2$:$H_2O$ (in a ratio of 1:7:8) for 20 minutes, wipe the ESC with a lint-free cleanroom wipe or 3M™ white Scotch Brite, rinse the ESC with UPW for 5 minutes, and blow off excess water with filtered nitrogen.

Place the ESC facing downward on the fixture, wipe the ceramic surface with a lint-free cleanroom wipe and solution of HCl:$H_2O_2$:$H_2O$ (in a ratio of 1:2:10) for a maximum of 3 minutes. A 3M™ white Scotch Brite can be used with the solution. Rinse the ESC, including all of the helium holes and channels, with UPW for 10 minutes and blow off excess water with filtered nitrogen.

Mount the ESC in an ultrasonic tank filled with UPW at room temperature and clean the ESC for 60 minutes. Rinse the ESC with UPW for 5 minutes and blow off excess water with filtered nitrogen. Remove the chemical resistant tape from the backside of the ESC, wipe the ESC with IPA, and rinse helium holes and channels on the backside of the ESC with IPA. Blow dry the ESC, including the helium holes and channels.

Move the ESC to a Class 100 Cleanroom and place it under a heating lamp or bake it in an oven at 120° C. for 90 minutes and allow the ESC to cool. Measure surface particles and surface roughness on the ceramic surface.

Example 3

Table II provides EDS elemental surface compositions analysis results for a used ESC both prior to and after the wet cleaning process. "Average" refers to a relatively large area of the ESC ceramic surface, e.g., magnification of 200 times. Accordingly, some contaminants may not be detected in the "average." In contrast, "particle" refers to individual particles or impurities on the ceramic surface of the ESC, including metal particles or electrode particles.

TABLE II

| Element | Average | | Particle | |
| --- | --- | --- | --- | --- |
| | Pre-Cleaning | Post-Cleaning | Pre-Cleaning | Post-Cleaning |
| O | 52.82% | 62.85% | 44.59% | 66.50% |
| F | 12.77% | 1.85% | 14.07% | — |
| Mg | 1.33% | 0.84% | 0.95% | 0.40% |
| Al | 32.07% | 34.02% | 28.87% | 29.15% |
| P | — | — | 3.29% | — |
| Ca | 0.23% | — | 0.51% | — |
| Ti | 0.63% | 0.45% | 2.59% | 4.39% |
| Fe | — | — | 4.61% | — |
| W | — | — | 0.52% | — |
| Si | 0.14% | — | — | — |

Example 4

Table III provides ICPMS elemental surface concentrations ($\times 10^{10}$ atoms/cm$^2$) for a used ESC both prior to and after the wet cleaning process. "Extraction" refers to a process wherein a chemical etching solution is applied to the ceramic surface of the ESC in order to dissolve surface contaminants into the solution. The solution is then collected for ICPMS analysis. Thus, the initial surface contamination level may be determined, as well as the level of contamination after the wet cleaning process and the efficiency of the wet cleaning process. By repeating the extraction process several times, the endpoint of the wet cleaning process may be determined. As the backside of process wafers will contact the surface of the ESC, the surface cleanliness of the ESC is desirable in wafer manufacturing processes.

TABLE III

| | | Post-Cleaning | | | |
|---|---|---|---|---|---|
| Element | Pre-Cleaning | First Extraction | Second Extraction | Third Extraction | Fourth Extraction |
| Aluminum (Al) | 540,000 | 260,000 | 82,000 | 85,000 | 82,000 |
| Antimony (Sb) | 58 | 18 | 0.58 | 0.66 | 0.55 |
| Arsenic (As) | <5 | 5.7 | <5 | <5 | <5 |
| Barium (Ba) | 61 | 140 | 38 | 48 | 39 |
| Beryllium (Be) | <20 | <20 | <20 | <20 | <20 |
| Bismuth (Bi) | <0.5 | <0.5 | <0.5 | <0.5 | <0.5 |
| Boron (B) | 9,500 | 5,500 | 1,700 | 2,400 | 2,200 |
| Cadmium (Cd) | 4.0 | 1.9 | 1.3 | <1 | <1 |
| Calcium (Ca) | 100,000 | 45,000 | 22,000 | 31,000 | 29,000 |
| Chromium (Cr) | 32 | <20 | <20 | <20 | <20 |
| Cobalt (Co) | 38 | 13 | <5 | 9.8 | 8.9 |
| Copper (Cu) | 330 | 160 | 23 | <10 | <10 |
| Gallium (Ga) | 63 | 41 | 9.9 | 16 | 15 |
| Germanium (Ge) | <2 | 96 | 190 | 210 | 64 |
| Iron (Fe) | 4,000 | 4,500 | 830 | 1,200 | 1,100 |
| Lead (Pb) | 42 | 7.1 | 0.80 | 0.89 | 0.71 |
| Lithium (Li) | 230 | 170 | 56 | 70 | 74 |
| Magnesium (Mg) | 120,000 | 92,000 | 37,000 | 40,000 | 38,000 |
| Manganese (Mn) | 65 | 29 | <5 | 15 | 14 |
| Molybdenum (Mo) | 13 | 54 | 15 | 22 | 21 |
| Nickel (Ni) | 200 | 140 | 42 | <10 | 11 |
| Potassium (K) | 4,100 | 700 | 170 | 290 | 300 |
| Sodium (Na) | 17,000 | 6,700 | 2,300 | 3,200 | 3,000 |
| Strontium (Sr) | 51 | 37 | 17 | 21 | 18 |
| Tin (Sn) | 68 | 6.5 | <5 | <5 | <5 |
| Titanium (Ti) | 43,000 | 46,000 | 11,000 | 13,000 | 13,000 |
| Tungsten (W) | 300 | 1,100 | 270 | 380 | 380 |
| Vanadium (V) | 9.2 | <5 | <5 | <5 | <5 |
| Zinc (Zn) | 1,900 | 1,700 | 72 | 30 | 32 |
| Zirconium (Zr) | 470 | 2,000 | 110 | 150 | 140 |

Examples 5–7

Tables IV–VI provide ICPMS elemental surface concentrations (×1010 atoms/cm$^2$) for three different used ESCs both prior to and after the wet cleaning process.

TABLE IV

| Element | Pre-Cleaning | Post-Cleaning |
|---|---|---|
| Aluminum (Al) | 560,000 | 7,600 |
| Antimony (Sb) | 270 | 1.0 |
| Arsenic (As) | <5 | <5 |
| Barium (Ba) | 99 | 41 |
| Beryllium (Be) | 99 | <20 |
| Bismuth (Bi) | <0.5 | <0.5 |
| Boron (B) | 3,500 | <200 |
| Cadmium (Cd) | 6.1 | <1 |
| Calcium (Ca) | 56,000 | 450 |

TABLE IV-continued

| Element | Pre-Cleaning | Post-Cleaning |
|---|---|---|
| Chromium (Cr) | 85 | <20 |
| Cobalt (Co) | 540 | <5 |
| Copper (Cu) | 200 | 19 |
| Gallium (Ga) | 11 | <1 |
| Germanium (Ge) | <2 | <2 |
| Iron (Fe) | 40,000 | 140 |
| Lead (Pb) | 28 | 3.8 |
| Lithium (Li) | 110 | <20 |
| Magnesium (Mg) | 35,000 | 360 |
| Manganese (Mn) | 100 | <5 |
| Molybdenum (Mo) | 21 | <2 |
| Nickel (Ni) | 640 | <10 |
| Potassium (K) | 27,000 | <50 |
| Sodium (Na) | 63,000 | 260 |
| Strontium (Sr) | 32 | <2 |
| Tin (Sn) | 76 | <5 |
| Titanium (Ti) | 13,000 | 240 |
| Tungsten (W) | 96 | <2 |
| Vanadium (V) | 34 | <5 |
| Zinc (Zn) | 3,100 | 120 |
| Zirconium (Zr) | 84 | 1.5 |

TABLE V

| Element | Pre-Cleaning | Post-Cleaning |
|---|---|---|
| Aluminum (Al) | 860,000 | 15,000 |
| Antimony (Sb) | 1.2 | 4.9 |
| Arsenic (As) | <5 | <5 |
| Barium (Ba) | 3,000 | 180 |
| Beryllium (Be) | <20 | <20 |
| Bismuth (Bi) | 1.5 | <0.5 |
| Boron (B) | 1,300 | 3,600 |
| Cadmium (Cd) | <1 | <1 |
| Calcium (Ca) | 1,100,000 | 2,200 |
| Chromium (Cr) | 1,200 | 130 |
| Cobalt (Co) | 46 | <5 |
| Copper (Cu) | 38 | 50 |
| Gallium (Ga) | 17 | 10 |
| Germanium (Ge) | <2 | <2 |
| Iron (Fe) | 7,900 | 510 |
| Lead (Pb) | 3.7 | 19 |
| Lithium (Li) | 82 | <20 |
| Magnesium (Mg) | 38,000 | 2,400 |
| Manganese (Mn) | <5 | <5 |
| Molybdenum (Mo) | <2 | <2 |
| Nickel (Ni) | 87 | <10 |
| Potassium (K) | 790 | 64 |
| Sodium (Na) | 4,300 | 700 |
| Strontium (Sr) | 630 | 6.5 |
| Tin (Sn) | <5 | <5 |
| Titanium (Ti) | 5,300 | 1,200 |
| Tungsten (W) | 260 | 26 |
| Vanadium (V) | <5 | <5 |
| Zinc (Zn) | 97 | 560 |
| Zirconium (Zr) | 180 | 17 |

TABLE VI

| Element | Pre-Cleaning | Post-Cleaning |
|---|---|---|
| Aluminum (Al) | 51,000 | 51,000 |
| Antimony (Sb) | 1.5 | 2.8 |
| Arsenic (As) | 17 | 6.5 |
| Barium (Ba) | 15 | 35 |
| Beryllium (Be) | <20 | <20 |
| Bismuth (Bi) | <0.5 | <0.5 |
| Boron (B) | 1,300 | 1,300 |
| Cadmium (Cd) | <1 | <1 |
| Calcium (Ca) | 2,800 | 1,800 |
| Chromium (Cr) | 700 | 280 |
| Cobalt (Co) | <5 | <5 |

TABLE VI-continued

| Element | Pre-Cleaning | Post-Cleaning |
| --- | --- | --- |
| Copper (Cu) | 90 | 36 |
| Gallium (Ga) | 8.8 | 9.6 |
| Germanium (Ge) | <2 | <2 |
| Iron (Fe) | 580 | 490 |
| Lead (Pb) | 6.4 | 15 |
| Lithium (Li) | 39 | <20 |
| Magnesium (Mg) | 2,400 | 2,500 |
| Manganese (Mn) | <5 | <5 |
| Molybdenum (Mo) | <2 | 2.0 |
| Nickel (Ni) | 33 | <10 |
| Potassium (K) | 190 | 110 |
| Sodium (Na) | 1,500 | 700 |
| Strontium (Sr) | 7.5 | 3.7 |
| Tin (Sn) | <5 | <5 |
| Titanium (Ti) | 1,800 | 1,600 |
| Tungsten (W) | 43 | 78 |
| Vanadium (V) | <5 | <5 |
| Zinc (Zn) | 380 | 140 |
| Zirconium (Zr) | 19 | 35 |

The ceramic surface layer of the ESC cleaned according to Table IV was titanium doped.

While various embodiments have been described, it is to be understood that variations and modifications may be resorted to as will be apparent to those skilled in the art. Such variations and modifications are to be considered within the purview and scope of the claims appended hereto.

What is claimed is:

1. A method of cleaning an electrostatic chuck useful for plasma etching of a dielectric layer on a semiconductor substrate, the chuck including a ceramic surface on which the semiconductor substrate is supported during the etching, the method comprising the steps of:
   a) contacting at least the ceramic surface of the chuck with isopropyl alcohol;
   b) contacting at least the ceramic surface of the chuck with a dilute acidic solution comprising a hydrofluoric acid and nitric acid mixture and/or a dilute acidic solution comprising a hydrochloric acid and hydrogen peroxide mixture;
   c) contacting at least the ceramic surface of the chuck with basic solution comprising hydrogen peroxide and ammonium hydroxide; and
   d) subjecting the chuck to ultrasonic cleaning;
   wherein contaminants are removed from the ceramic surface of the chuck.

2. The method of claim 1, wherein the contaminants are selected from the group consisting of metallic impurities, organic impurities, fluoride impurities, electrode impurities, silicon particles, surface particles, and combinations thereof.

3. The method of claim 1, further comprising protecting electrical contacts and exposed bonding material on the chuck by covering the electrical contacts and bonding material with masking material and/or chemical resistant tape.

4. The method of claim 1, wherein the cleaning comprises immersing the chuck in the isopropyl alcohol, the basic solution, and/or water during the ultrasonic cleaning.

5. The method of claim 1, wherein the chuck is a used chuck previously used for supporting a semiconductor substrate during plasma etching of a dielectric layer on the semiconductor substrate, the used check and the cleaning comprises cleaning the ceramic surface with a scouring pad.

6. The method of claim 1, further comprising testing performance of the chuck in a plasma etching chamber before and/or after the chuck has been cleaned.

7. The method of claim 1, further comprising analyzing the ceramic surface to determine whether contaminants are found on the ceramic surface before and/or after the cleaning.

8. The method of claim 1, comprising supporting the chuck in a fixture with the ceramic surface facing downward while wiping the ceramic surface with the dilute acidic solution and/or tetramethyl ammonium hydroxide.

9. The method of claim 1, comprising contacting at least the ceramic surface of the chuck with a dilute acidic solution comprising a hydrofluoric acid and nitric acid mixture and a dilute acidic solution comprising a hydrochloric acid and hydrogen peroxide mixture.

10. The method of claim 1, wherein step b) follows step a), step c) follows step b), and step d) follows step c).

11. The method of claim 2, wherein the chuck is a used chuck previously used for supporting a semiconductor substrate during plasma etching of a dielectric layer on the semiconductor substrate, the used check containing fluoride impurities selected from the group consisting of aluminum fluoride, titanium fluoride, and combinations thereof on the ceramic surface, the cleaning further comprising contacting the ceramic surface of the chuck with tetramethyl ammonium hydroxide so as to remove fluoride impurities.

12. The method of claim 2, wherein the chuck is a new or used chuck previously used for supporting a semiconductor substrate during plasma etching of a dielectric layer on the semiconductor substrate, the used check containing organic impurities, the cleaning removing organic impurities with the isopropyl alcohol and/or the basic solution.

13. The method of claim 2, wherein the chuck is a new chuck containing metallic impurities selected form the group consisting of iron, chromium, nickel, molybdenum, vanadium, and combinations thereof, the cleaning removing metallic impurities with the basic solution and/or the dilute acidic solution.

14. The method of claim 2, wherein the chuck is a used chuck previously used for supporting a semiconductor substrate during plasma etching of a dielectric layer on the semiconductor substrate, the used check containing fluoride impurities including titanium fluoride, the cleaning removing titanium fluoride with the basic solution.

15. The method of claim 2, wherein the chuck is a used chuck previously used for supporting a semiconductor substrate during plasma etching of a dielectric layer on the semiconductor substrate, the used check containing silicon particles selected from the group consisting of Si, $SiO_2$, and combinations thereof, the cleaning removing silicon particles with the dilute acidic solution.

16. The method of claim 2, wherein the chuck is a new chuck containing
   electrode impurities selected from the group consisting of tungsten, phosphorus, and combinations thereof; and
   metallic impurities selected form the group consisting of iron, chromium, nickel, molybdenum, vanadium, and combinations thereof;
   the cleaning removing electrode and metallic impurities with the dilute acidic solution.

17. The method of claim 2, wherein the ultrasonic cleaning removes surface particles from the ceramic surface and particles trapped inside lift pin holes and other passages in the chuck.

18. The method of claim 5, wherein the scouring pad removes polymer buildup on the used chuck.

19. The method of claim 15, wherein the dilute acidic solution comprises the hydrofluoric acid and nitric acid mixture, the cleaning removing silicon particles with the hydrofluoric acid.

20. The method of claim 16, wherein the dilute acidic solution comprises the hydrofluoric acid and nitric acid mixture, the cleaning removing electrode and metallic impurities with the nitric acid.

21. The method of claim 16, wherein the dillute acidic solution comprises the hydrochloric acid and hydrogen peroxide mixture, the cleaning removing electrode and metallic impurities with the hydrochloric acid and hydrogen peroxide mixture.

* * * * *